United States Patent
Usenko

(10) Patent No.: US 6,352,909 B1
(45) Date of Patent: Mar. 5, 2002

(54) PROCESS FOR LIFT-OFF OF A LAYER FROM A SUBSTRATE

(75) Inventor: Alexander Yuri Usenko, Murray Hill, NJ (US)

(73) Assignee: Silicon Wafer Technologies, Inc., Newark, NJ (US)

(*) Notice: Subject to any disclaimer, the term of this patent is extended or adjusted under 35 U.S.C. 154(b) by 0 days.

(21) Appl. No.: 09/578,896

(22) Filed: May 26, 2000

Related U.S. Application Data

(60) Provisional application No. 60/174,659, filed on Jan. 6, 2000.

(51) Int. Cl.[7] .......................... H01L 21/30; H01L 21/46
(52) U.S. Cl. ........................................ 438/458; 438/459
(58) Field of Search .................................. 438/455–459

(56) References Cited

U.S. PATENT DOCUMENTS

| | | | |
|---|---|---|---|
| 4,846,931 A | | 7/1989 | Gmitter |
| 5,250,460 A | | 10/1993 | Yamagata |
| 5,374,564 A | | 12/1994 | Bruel |
| 5,877,070 A | * | 3/1999 | Goesele et al. ............. 438/458 |
| 5,994,207 A | | 11/1999 | Henley |
| 6,191,007 B1 | * | 2/2001 | Matsui et al. ................ 438/459 |
| 6,255,195 B1 | * | 7/2001 | Linn et al. ................... 438/455 |

OTHER PUBLICATIONS

P. de Mierry, A. Etcheberry, M. Aucouturier, "Electrolytic Hydrogenation of p–type Silicon Bulk and Surface Modifications" Physica B: Condensed Matter, v.170, No. 1–4, Apr. 1991, pp. 124–128.

7. S.J. Pearton, W.L. Hansen, E.E. Haller, J.M. Kahn, "Hydrogenation of Gold–related Levels in Silicon by Electrolytic Doping", Journal of Applied Physics, vol. 55, No. 4, pp. 1221–1223, 1984.

8. G.S. Oehrlein, J.L. Lindstrom, J.W. Corbett, "Electrolytical Method for Hydrogenation of Silicon", Physics Letters, vol. 81A, No. 4, pp246–248, 1981.

M.N.V. Raghavan, V. Venkataraman, "Enrhanced Room Temperature Mobilities and Reduced Parallel Conduction in Hydrogen Passivated Si/SiGe Heterostructures", Semiconductor Science and Technology, v.13, pp. 1317–1321, 1998.

* cited by examiner

Primary Examiner—Charles Bowers
Assistant Examiner—Erik J Kielin
(74) Attorney, Agent, or Firm—DeMont & Breyer, L.L.C.

(57) ABSTRACT

Process for lift-off of a thin layer from a crystalline substrate, preferably the layer from a silicon wafer to further form a silicon-on-insulator (SOI) sandwich structure, wherein a separative interlayer comprises a thin quasi-continuous gaseous layer and said interlayer is obtained by gettering a monatomic hydrogen into a preformed buried defect-rich layer preferably obtained by implantation. The monatomic hydrogen is preferably inserted into the substrate by electrolytic means.

18 Claims, 5 Drawing Sheets

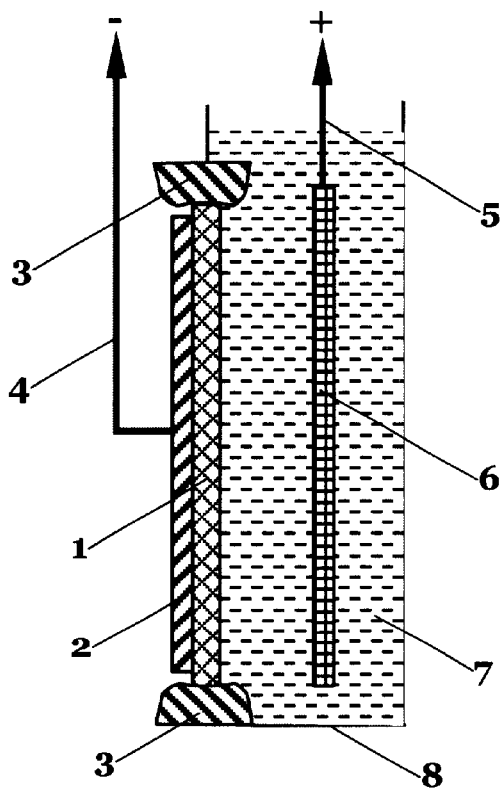
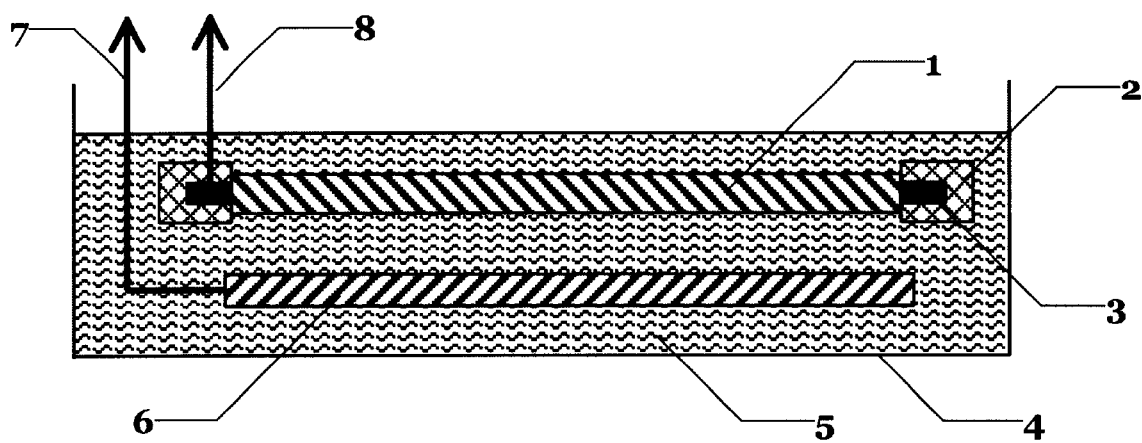

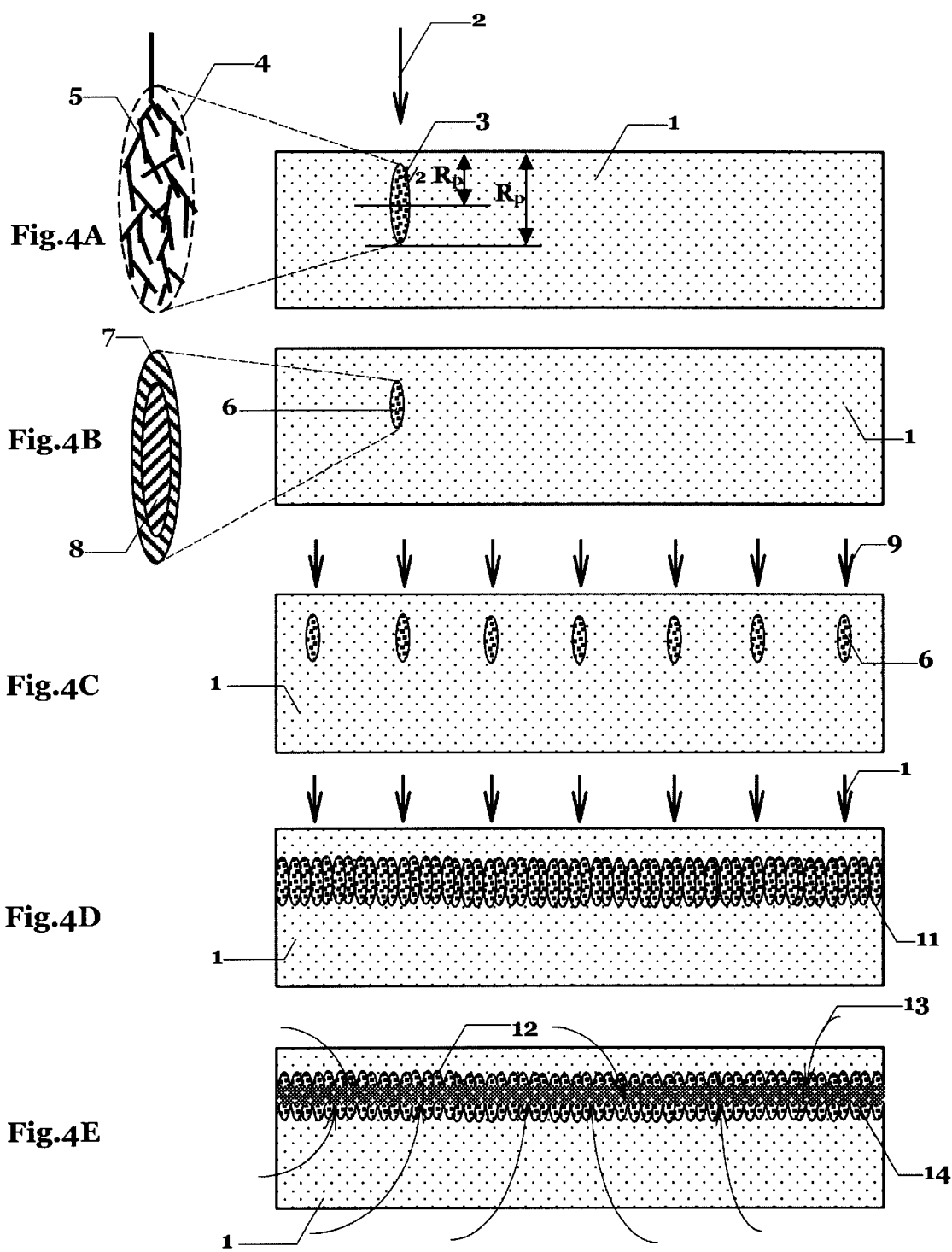

PROCESS FOR LIFT-OFF OF A LAYER FROM A SUBSTRATE

This application claims priority from the provisional patent application entitled "Process for Lift-off a Layer from a Substrate", Provisional Application Ser. No. 60/174,659, filed Jan. 6, 2000, the disclosure of which is hereby incorporated in its entirety for all purposes.

FIELD OF THE INVENTION

The present invention generally relates to processes for fabricating silicon-on-insulator wafers, and more particularly, to a technology for thinning of a semiconductor substrate by separating a layer from an initial substrate with a hydrogen interlayer.

BACKGROUND OF THE INVENTION

In previous art, a process for lift-off of a thin layer from a substrate has been described by Gmitter at al. [1]. This process uses etching of sacrificial layer. A disadvantage of the process is that the layer that can be lifted off is limited to about 1 cm$^2$ in area. Fabrication of silicon-on-insulator wafers, however, currently requires lifting off layers with an area of 100 to 1000 cm$^2$.

Another process known from previous art is thinning of a substrate by etching away the substrate until an etch stop layer is reached. For example, in the invention by Yonehara [2] a porous silicon layer inside of crystalline silicon wafer is used as the etch-stop layer. A disadvantage of etch-stop based processes is that an entire semiconductor wafer is thus sacrificed and cost is thus increased.

Yet another process for separating of semiconductor substrate is known due to invention by Bruel [3]. In this process a gaseous interlayer is formed inside of semiconductor wafer by the sequence of process steps (1) implantation of hydrogen, (2) stiffening the surface that was implanted through to prevent blistering, and (3) transforming of the implanted hydrogen into quasi-continuous hydrogen layer. A disadvantage of the process is that a high implant dose is needed ($10^{17}$/cm$^2$ for monatomic hydrogen or 5×10$^{16}$/cm$^2$ for diatomic hydrogen). The total cost of the SOI-end-product wafer using this process is increased by the cost of the implantation.

A slight improvement to the previous process is known due to invention by Goesele [4]. Due to Goesele's process a two-species implantation (boron and hydrogen) is used that allows lowering the total dose needed by about 20%. Boron is implanted first and it works as a trap-inducing step to reduce the density of hydrogen implant required. Under subsequent annealing the implanted hydrogen is fully gettered by the trap layer, thus lowering the hydrogen losses through effusion. All implanted hydrogen is thus used to build hydrogen platelets that are useful for the lift-off process. A disadvantage of this process is that the implantation dose (and related cost) remains high. Another disadvantage of Goesele's process is that hydrogen implantation produces defects and the as-implanted wafer contains the hydrogen in a trapped form. In the subsequent annealing process Goesele teaches that the implanted hydrogen releases from its attachments to hydrogen implantation-induced defects, and attaches to boron implant-induced defects. Releasing from attachments requires annealing out of defects. Both hydrogen- and boron- implantation-induced defects have similar microscopic nature, and same annealing temperatures. Therefore when hydrogen is released, the boron-induced traps are mostly annealed out, and the hydrogen re-attachment process is not very effective. That is why only a 20% improvement in total implant dose was obtained by Goesele.

Another improvement of Bruer s process is described in the invention by Henley at al. [5]. This process uses plasma immersion ion implantation instead of conventional implantation to insert hydrogen into silicon. A disadvantage of the process is that plasma immersion implantation results in an energy distribution of incident hydrogen over a wide energy range to about 50–80 keV. This results in a lo times increase of minimum implant dose needed for cleavage (i.e. $10^{18}$ cm$^2$ instead of $10^{17}$ cm$^2$). This high dose damages the layer to be lifted off, and the quality of the final SOI wafer is lower as compared to wafers obtained using Bruel's process. Another problem of plasma immersion is that the high dose implantation can result in severe damage to the wafer surface. This surface should be immediately attached (without any intermediate heat treatment to heal the surface) after implantation to a stiffener wafer. Prebonding of the damaged surface to another surface is not effective. Thus plasma immersion lowers the production yield of silicon-on-insulator wafers significantly.

Besides implantation, another process is known to insert the hydrogen into silicon and is described in papers published by de Mierry at al. [6], Pearton at al. [7], Oehrlein at al. [8], Raghavan at al. [9]. The process uses electrolytic insertion of the monatomic hydrogen into silicon. Monatomic hydrogen diffuses inside crystalline silicon at room temperature thus allowing easy doping of silicon with hydrogen. However, electrolytic insertion cannot be directly applied by itself alone to achieve a substrate split. The present invention describes a process utilizing electrolytic insertion to achieve lift-off of surface films.

SUMMARY OF THE INVENTION

The present invention relates to a method for lifting off of a thin layer from a crystalline substrate. The fractured layer may be further attached to another substrate thus forming, for example a silicon-on-insulator (SOI) wafer.

In a first step in the inventive process a hydrogen trap-inducing implantation of an element is performed where said element is preferably the same as the substrate material (for example, silicon in case of a silicon wafer). This described self-implantation has two major advantages for this process (a) it does not contaminate the substrate, and (b) bombarding a target with particles having the same mass as atoms of target allows the most effective energy transfer from bombarding particle to an atom of the target thus maximizing atomic displacements. The purpose of said implantation is to obtain a buried amorphous layer. The amorphized layer is a trap for monatomic hydrogen inserted at the next step of the inventive process.

In a second step a hydrogen insertion by electrolytic means is carried out which supplies hydrogen in an amount that is enough to subsequently form a quasi-continuous gaseous interlayer in the region of amorphization.

In a third step the substrate is subjected to a sensitizing heat-treatment at an elevated temperature for a given time. Said heat treatment is chosen such that the hydrogen in the substrate which was introduced by the hydrogen electrolytic insertion and trapped by the buried amorphized layer does nucleate into platelets. This treatment causes the formation and growth of hydrogen filled platelets at a depth close to the depth of the buried amorphized layer. Said heat treatment must be maintained below a temperature which causes hydrogen induced surface blisters which in turn would prevent subsequent effective bonding of the substrate to a stiffener wafer.

In a fourth step an intimate and strong bond between the substrate and the stiffener is realized by direct wafer bonding or other bonding techniques.

In a fifth step the bonded structure consisting of the composite substrate and stiffener is heat-treated at a transfer temperature whereby the implanted hydrogen in the substrate is fully released from defects which were generated by the hydrogen trap-inducing amorphization. Said heat treatment results in growth, overlapping and coalescence of hydrogen-filled platelets. Said platelets split the monocrystalline thin layer from the rest of the substrate thereby transferring the thin monocrystalline layer to the stiffener which completes the lift-off process.

BRIEF DESCRIPTION OF THE DRAWINGS

FIG. 3. Preferable electrolytic bath designs.

FIG. 4. Schematic illustration to explain phenomena involved in the process of collecting hydrogen into the trap layer.

DETAILED DESCRIPTION OF THE FIRST PREFERRED EMBODIMENT

This invention reduces the ion implantation dose needed for the lift-off process. Said ion implant dose is decreased by more then an order of magnitude compared to conventional hydrogen processes. Furthermore, the disclosed process permits a thinner top silicon layer in the final SOI wafer with better thickness control then can be obtained with the conventional processes.

Figure 2A:
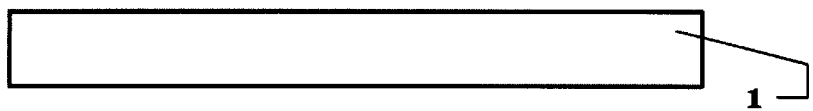
FIG. 2. Process steps in first preferred embodiment.

The embodiment which will now be described shows a method for the lift-off of a thin layer from a monocrystalline silicon substrate. The released layer maybe further transferred onto a second substrate that is the stiffener. This preferred embodiment involves trap-inducing silicon ion implantation into the silicon substrate followed by an electrolytic charging of the traps in the silicon substrate with hydrogen. The initial silicon substrate is schematically shown on FIG. 2A.

Figure 2B:
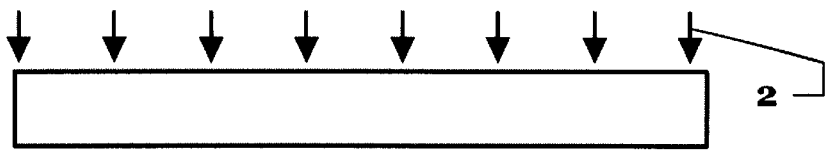

530 micrometer-thick monocrystalline silicon substrates with (100) crystallographic surface orientation are used. A 500 Å-thick thermal oxide covers the surface of the silicon substrate. The trap inducing implantation 2, FIG. 2B is performed with singly and positively charged silicon ions at 180 keV with a dose of $5 \times 10^{14}$ cm$^{-2}$. The implantation forms a implanted silicon depth concentration distribution with a maximum at a depth $R_p$ of approximately 0.5 micrometers. Maximum concentration of displaced atoms occurs at a depth of $\frac{1}{2}R_p = 0.25$ micrometers. The wafer temperature is maintained near room temperature during implantation. The wafer is preferably kept at lowest possible temperature during implantation. It maximizes number of traps for hydrogen created.

Figure 2C:
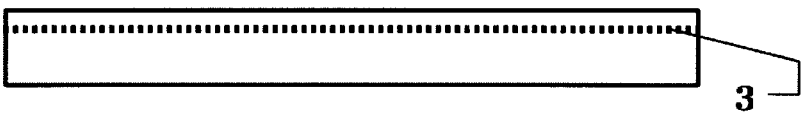

The next process step indicated in FIG. 2C creates a buried amorphous layer 3 as a result of implantation.

Figure 2D:
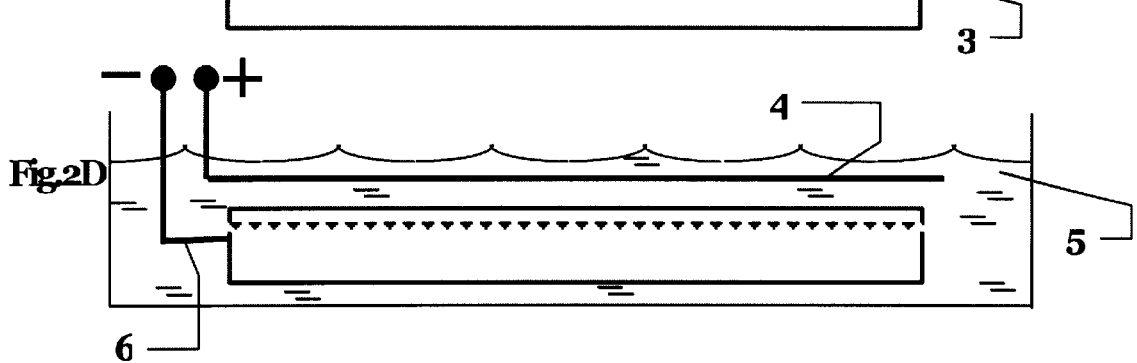

The next step utilizes the electrolytic bath with electrolyte 5 in FIG. 2D. The electrolyte is chosen from acids preferably $H_2SO_4$, HCl, or HF. The silicon wafer is made a cathode of the electrolytic cell with electrical contact 6. The anode 4 is typically platinum or graphite. This electrolyte cell is used to inject hydrogen into the silicon. The sample was charged for 2 hours at a current density of about 0.1 A/cm$^2$.

The former amorphous layer 3 is now completely passivated (saturated) with hydrogen, and the hydrogen density is about $10^{18}$ cm$^2$ in this layer.

Figure 2E:

Next the silicon wafer with the hydrogen rich layer is removed from the electrolytic cell and subjected to surface cleaning and surface activation preparatory to direct wafer bonding with the stiffener wafer 7 in FIG. 2E. The stiffener wafer is also made of crystalline silicon and is subjected to the same cleaning and surface activation procedure as the wafer with the hydrogen-rich layer. FIG. 2E shows both wafers brought into intimate contact and prebonded.

Figure 2F:
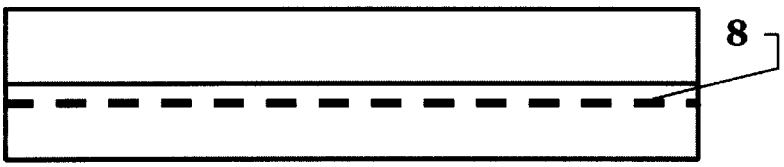

FIG. 2F schematically indicates changes in the wafer assembly that happen during the 200° C.-annealing step. At this step the hydrogen is captured onto broken bonds inside of amorphized layer and it redistributes nucleating into hydrogen-filled platelets 8.

Figure 2G:
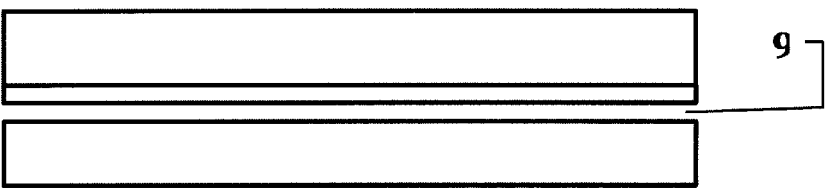

Next with further annealing at temperatures of 300° C. or higher the platelets collapse into a continuous layer 9. The top and bottom parts of the former wafer assembly FIG. 2F now separate as shown in FIG. 2G. Thus the lift-off process is completed.

The first preferred embodiment describes a lift-off layer containing a top silicon dioxide sublayer and a bottom crystalline silicon layer. However the method of invention can be also applied to fracture layers including one or more sublayers. What is important is that the bottom sublayer must be a layer that has the property of collapsing inserted hydrogen into platelets under thermal annealing or with other kind of energy excitation, for example, ultrasound treatment. This property is inherent to crystalline silicon and to some other crystals including germanium, Si—Ge alloys, gallium arsenide, and also crystallized polypeptides. Top layers must have adhesion to underlying layers so the sandwich maintains a composite structure. Examples of composite layers include silicon dioxide, silicon nitride, aluminum, aluminum oxide, silicides, diamond, and sapphire. The total allowable thickness of the lifted layer depends on the method of creating the trap layer. If ion implantation is used for making the trap layer, the total thickness of the lift-off layer will not exceed ½ of the projection range $R_p$ of the implanted ions.

The trap-inducing step should generate at least $10^{17}$ cm$^{-2}$ silicon broken bonds so that hydrogen can be inserted in the amount exceeding the level needed to form a continuous platelet layer. The trap-inducing step should create a trap density approximately equal to the number of atoms in two monatomic layers of the silicon lattice ~$10^{16}$ cm$^{-2}$. A convenient way to make a buried trap layer is to use ion implantation. To create the trap an atom of lattice is displaced from its regular position in the lattice thus forming a vacancy and interstitial atom (a Frenkel pair). Silicon has four bonds so a single displacement means forming 8 silicon broken bonds (4 of them linked to an interstitial silicon atom and 4 others linked to 4 atoms surrounding a vacancy in silicon lattice). Each implanted ion can generate up to $E_{ion}/E_{bond}$ displacements in a target, where $E_{ion}$ is the energy of bombarding ion, and $E_{bond}$ is an energy that is needed to remove an atom of target from its place in the lattice. The typical energy of bombarding ions $E_{ion}$ is 30–300 keV. The energy $E_{bond}$ for removing a silicon atom from the silicon lattice is 12 eV. Thus each bombarding ion can generate up to about $10^4$ displacements. Accordingly, to generate about $10^{17}$ cm$^{-2}$ broken bonds an implantation dose exceeding $10^{12}$ cm$^{-2}$ is needed. This is a dose that is about 5 orders of magnitude lower than the dose of hydrogen implantation needed in Bruel's process [3] (Smartcut™) or its versions (Genesis™, etc.). Since implantation with dose of $10^{17}$ cm$^{-2}$ is costly and time consuming, the process due to the present invention reduces fabrication expenses and process time.

The dose needed to form an effective trap layer for hydrogen is in the range of $10^{13}$ to $10^{15}$ cm$^{-2}$. This dose is still much lower than the dose needed for conventional processes. Choice of the optimal dose is explained in the following. While a bombarding ion makes the displacements, some of the displaced atoms return to their previous places in lattice. Thus some of the displacements self-anneal or annihilate. In practice, 90 to 99% of the displacements do annihilate, depending mostly on the target temperature. At low temperature (liquid nitrogen) self-annealing is suppressed, and at higher temperature the self-annealing effect increases. That is why low temperature implantation is preferred for use in the present invention.

While a bombarding ion is penetrating the silicon lattice, the displacement cascade 3 proceeds with a cigar shape oriented along the ion trajectory in FIG. 4A. The displacement cascade is also known as the disordered region. The disordered region contains an inner vacancy-rich region 8 and an outer interstitial-rich region 7 in FIG. 4B. The vacancy-rich region serves as an effective hydrogen trap while the interstitial-rich region does not trap the hydrogen. Monatomic hydrogen diffuses through the interstitial-rich outer region to be then trapped in the inner part of the displacement cascade. The interstitial-rich layer has a moderate (~0.7 eV) potential barrier for hydrogen. The diffusion coefficient of hydrogen through outer part of the displacement region is low. This diffusion coefficient is about equal to diffusion coefficient of hydrogen in amorphous silicon. The diffusion coefficient of monatomic hydrogen H+ in crystalline silicon $9.7 \times 10^{-3}\exp(-0.48\ eV/kT)$ from Van Wieringen and Warmolz. The diffusion coefficient for monatomic hydrogen in the interstitial-rich region is about 4 orders of magnitude lower. The trapping of hydrogen onto vacancy-facing silicon broken bonds is dependent on the implantation dose. With the increase in the implant dose, the individual cigar-shaped disordered regions become spaced more densely (FIG. 4C), next they overlap, and finally they form a continuous amorphized layer (FIG. 4D).

A further increasing in the implantation dose increases the thickness of the amorphized layer 11 FIG. 4D, and the upper boundary of the amorphized layer at some dose level reaches the silicon surface. Widening of the amorphized layer is undesirable, because to effectively lift-off a layer the fracture plane should be defined precisely and thin. Otherwise the platelets appear on different crystal planes which causes an increased surface roughness of the lifted-off layer. An amorphized layer of minimum thickness contains about $10^{18}$ cm$^{-2}$ hydrogen trap sites which is enough for further continuous platelet layer formation. This minimum thickness is approximately 0.1 micrometer and is approximately equal to the inner region 8 of the disordered region of FIG. 4B. Going beyond the amorphization threshold is not desirable. There is an optimum implant density which results in an atomically flat surface of the lifted-off layer.

The optimum dose of ion implantation is slightly larger than the amorphization threshold. This optimum dose can be calculated for particular cases using previous art described in, for example "Handbook of Ion Implantation Technology" ed.by J. F. Ziegler, North-Holland, 1992.

FIG. 4 schematically illustrates phenomena involved in the process of collecting hydrogen into the trap layer within the silicon wafer. Accordingly, in FIG. 4A silicon wafer 1 is implanted with bombarding ions 2 that penetrate the top surface of the silicon wafer 1 and form a disordered (amorphized) region 3. Region 3 is shown enlarged as 4. The disordered region 3 is formed due to numerical displacements of silicon atoms. Recoil atom trajectories 5 are shown as displacements. Atoms in the disordered region move into thermally stable positions at a given temperature. The disordered region 3 decreases in size due to the self annealing process as is shown on FIG. 4B. The transformed disordered region 6 of FIG. 4B consists of outer region 7 which is interstitial-rich silicon and an inner part 8 which is vacancy-rich silicon.

The amorphization threshold depends on the implantation dose, the ion mass, the ion energy, and the substrate temperature. The critical phenomena controlling amorphization is self-annealing. In addition to the above list of parameters, self-annealing also depends on the depth of the amorphous-crystalline interface (the closer to the surface, the more effective). To survive, a disordered region formed by a displacement cascade should exceed a threshold size. At room temperature light ions (boron, hydrogen) make small cascades, that self-anneal without producing disordered regions. Therefore silicon cannot be amorphized with light ions at room temperature. However, at lower temperatures light ions can amorphize silicon. Medium ions (silicon) do amorphize silicon at room temperature when dose exceeds $10^{15}$ cm$^{-2}$. Heavy ions (krypton, antimony) amorphize silicon at room temperature with dose as low as ~$10^{14}$ cm$^{-2}$.

With heavy ion implants the buried amorphized layer begins not deeper than 0.1 micrometer even at high ~300 keV energy. Layers thinner than about 0.1 micrometer can be lifted-off using heavy ion implants. For facilitating lift-off of layers of less than 0.1 micrometer thickness heavy ions are preferable. Medium mass ions allow layer up to 0.5–0.8 micrometers thickness to be lifted-off. For the manufacture of SOI wafers in mainstream state of the art CMOS ULSI with feature size of 0.18 micrometers, medium mass ions are preferable for creating the amorphized region. The lightest ions (protons) permit lift-off of layers up to 10 micrometers thick for 1.6 MeV protons implanted at a dose of $10^{14}$ cm$^{-2}$ and with the substrate at liquid nitrogen temperature. Use of the lightest ions is preferable for fabricating thick top layer SOI for applications such as MEMS, power transistors and p-i-n diodes. An additional advantage of using the lightest ions is that blistering phenomena is suppressed. Accordingly, thick layer can be lifted off without using a stiffener wafer.

It is generally preferable that the ion implant specie used to form the trap layer does not contaminate or dope silicon. From this consideration, the best implants are silicon ions. However, implanting of electrically inactive species like helium is also appropriate.

The implanted specie is mostly deposited around the projected range depth $R_p$, while cleaving plane proceeds close to $½R_p$ plane. Thus the majority of implanted ions are left in substrate side and not in lifted-off layer. Accordingly, for processes that do not use repeated slicing of layers from the same substrate, contamination or doping with implanted specie is reduced.

The electrolyte used for hydrogen insertion can be chosen from compounds that are either liquid or soluble in water such as $H_3PO_4$. These electrolytes must dissociate and release monatomic hydrogen, have a high dissociation coefficient, and not damage silicon either by oxidation or by fast etching. Strong acids satisfy these requirements the best. HF in water does not oxidize silicon, etches silicon very slowly, and is almost 100% dissociated releasing atomic hydrogen at high concentration. Also other acids as HCl, and $H_2SO_4$ can be used. Acids such as acetic acid $H_3COOH$ oxidizes the silicon surface, and are not desirable for the present invention.

The electrolytic bath is designed in different ways. Previous art describes the design of an electrolytic cell compatible with a cleanroom environment [Bardwell et al. [J. A. Bardwell, L. leBrun, R. J. Evans, D. G. Curry, R. Abbott, "Cleanroom Compatible Anodization Cell for 150 mm Si wafers", Review of scientific Instruments, V.67, No.6, p.2346–2355, 1996]. This described cell is appropriate for purposes of the present invention with a change of electrical polarity and some other minor changes. FIG. 3A and B show two different embodiments for the electrolytic cell. The cell shown on FIG. 3A exposes only one wafer surface to electrolyte and makes the opposite surface accessible for electrical contact. A hermetic gasket 3 made from an elastic and chemically stable material surrounds the silicon wafer 1 with contacting plate 2 attached. Wire 4 connects to the negative voltage potential. Wire 5 connects to the positive voltage potential. Graphite anode 6 connects to the wire 5. The assembly placed into bath 8 with electrolyte 7.

FIG. 3B shows an alternate design of the cell with electrical contact 3 to the periphery of silicon wafer 1 immersed into electrolyte 5 in bath 4 and having contact fixture 2 to the wafer 1. The anode electrode 6 is typically made from graphite, or platinum, and electrically connected to the voltage source via wire 8.

A more specialized electrolytic cell design FIG. 3A is preferred for hydrogenation of high resistivity wafers. Design FIG. 3B is preferred for layers that include insulator Si-$SiO_2$ layers, for example. In this specialized design hydrogen diffuses to the trap layer through the entire silicon wafer from the wafer backside.

Additional electrolytic cells of other types can be also used according to the state of the art described for example in "Electrochemical Cell Design and Optimization Procedures" ed.by Dechema, John Wiley & Sons, 431 pp., 1991.

At the beginning of the electrolytic hydrogenation process, the electrical current through the circuit is usually low because of a native nonconducting oxide on the surface of the silicon wafer. During the electrolytic process the native oxide dissolves. The current through the electrolytic cell gradually increases as the tunneling barrier through the oxide is reduced. Current flows at an approximate constant level until all hydrogen traps in the silicon wafer get passivated with the hydrogen. Then current decreases and the wafer is removed from the electrolyte. When charging the wafers wth amorphized buried layer, hydrogen has penetrated into the vacancy rich layer and diffuses quickly along the passivated parts of the vacancy-rich layer. Hydrogen is trapped thus expanding the passivated area. Due to this phenomena, it is not effective to stop the charging before the current decreasing stage, otherwise the platelets do not form the continuous layer through entire wafer area and only a partial lift-off is obtained.

For low dose implanted wafers the charging current decreases more gradually at the end of the hydrogenation process. This is because an individual disordered region does not overlap to form a continuous amorphized layer. Hydrogen goes to its traps through a potential barrier defined by interstitial rich envelope of each individual disordered region. However, high yield layer lift off is still attainable in this mode.

Continuing electrolytic charging will degrade the wafer surfaces due to preferable etching of the wafer at sites of surface microdefects. The total charge required depends on the total number of the hydrogen trap sites, and it falls in a range of $10^{-2}$ to 1 Coulomb/$cm^2$. Higher Coulombic values correspond to wafers with a buried amorphized layer, and lower values correspond to low dose implanted wafers.

An annealing step follows the hydrogenation, where the outer interstitial-rich layer of the hydrogen trap layer anneals out and hydrogen redistributes inside the trap layer with a trend to non-uniform distribution. This annealing step creates hydrogen precipitates. These precipitates form seeds for the hydrogen platelets. The platelets form preferentially along crystallographic planes <111> and <100>. Further annealing causes the platelet ripening. Ripening means that for two neighboring platelets, the bigger one continues to grow at the expense of smaller one, and finally only single platelet remains. For <111> oriented silicon wafers ripening of the initial <111> nuclei gives a cleavage front that is close to an atomically perfect <111> surface. For the more application-important <100> silicon wafers, a <100> oriented, preamorphized layer makesformation of <100> platelets more effectivep than <111> ones. Thus <100> layers are successfully lifted off.

Figure 1:
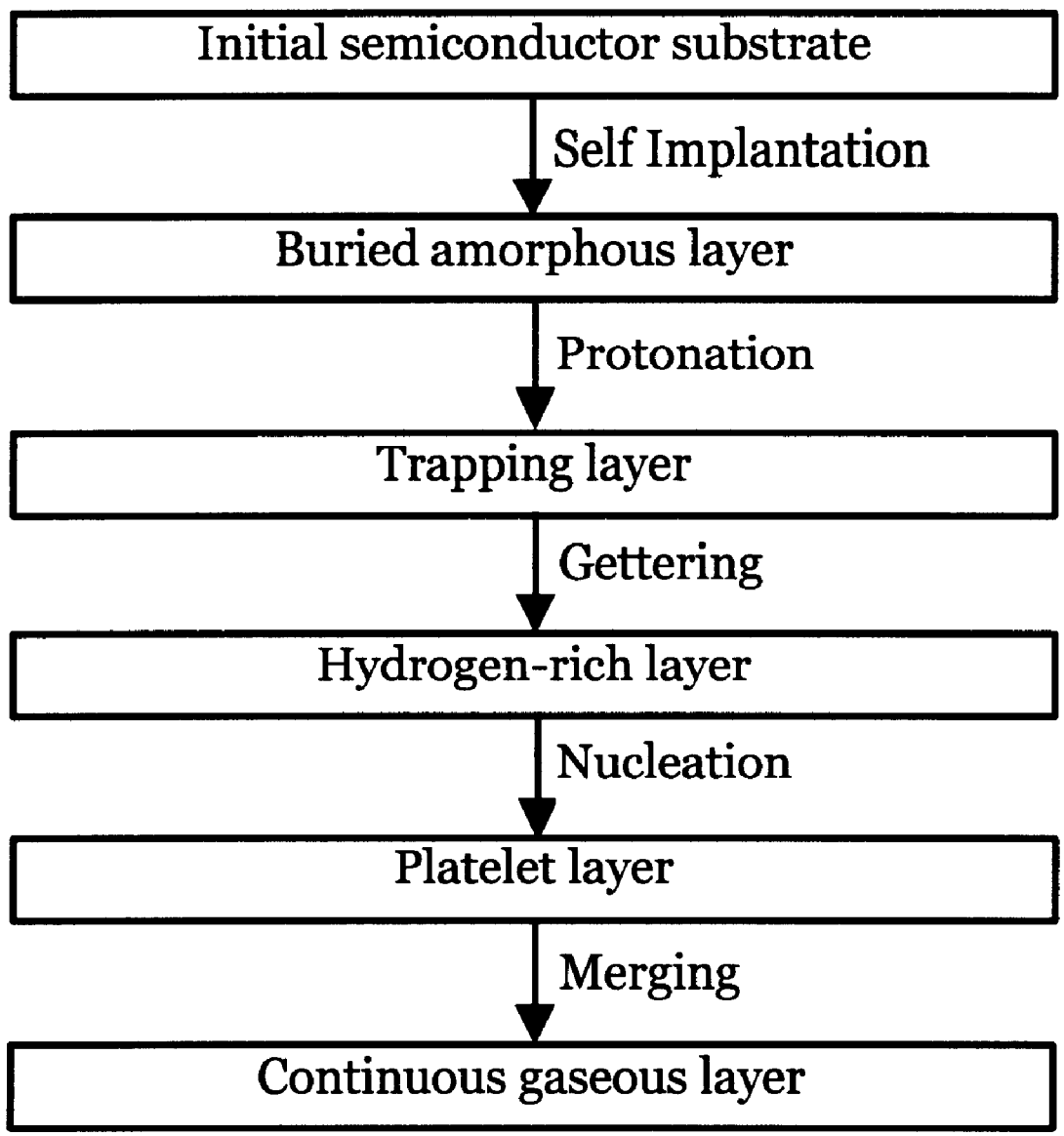
FIG. 1. Sequence of changes in the substrate from initial substrate to formation of a hydrogen quasi-continuous interlayer.

FIG. 1 schematically shows the general process steps embodied in the present invention. The text in boxes lists the state of silicon structure each step. The text between boxes explains the phenomena that transforms the structure to the next state.

DETAILED DESCRIPTION OF THE SECOND PREFERRED EMBODIMENT

A second embodiment will now be described, which uses RF hydrogen plasma to saturate the preformed hydrogen traps for the lift-off of thin, single-crystalline silicon layers from a single-crystalline silicon substrate.

Figure 5:
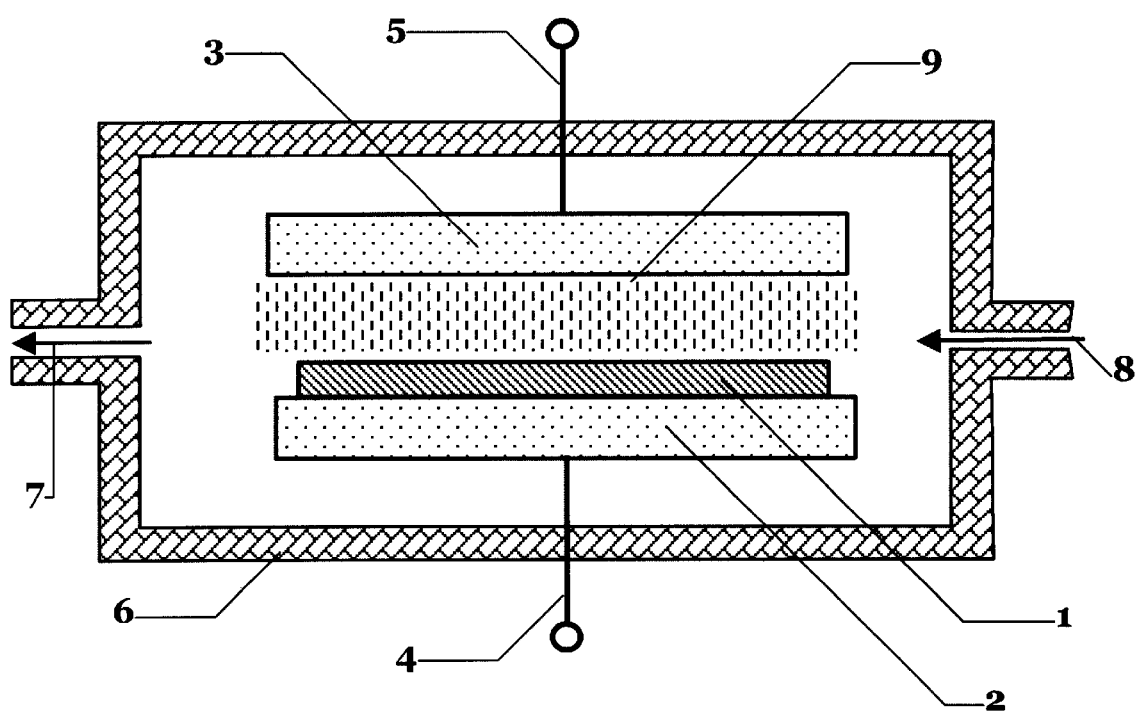
FIG. 5. Illustration of plasma hydrogenation process step described in the second preferred embodiment.

The process sequence for this preferred embodiment is the same as shown on FIGS. 2A–G except for step FIG. 2D which is the hydrogenation of traps. In this embodiment, instead of the electrolytic bath, the wafer is exposed to RF hydrogen plasma in the chamber of FIG. 5. The sample wafer 1 was placed on a platform 2 in the down-stream of the plasma. The plasma chamber 6 was pumped down to a base pressure of $10^{-6}$ Torr through pump chamber output 7 then filled with hydrogen through hydrogen input 8. Hydrogen chamber pressure was maintained at 2 Torr. The platform 2 was grounded through wire 4 and a 13.56 MHz RF power generator was connected to plate 3 through wire 5. A monatomic hydrogen plasma 9 was thus generated. The sample wafer was treated with a plasma power of 10 Watt for a period of 1 hour. After the wafer was unloaded from the plasma chamber the same process steps as shown on FIGS. 2E–G were performed. A successful lift off was observed.

For RF plasma hydrogenation the end point of hydrogenation process is more difficult to detect. However, since a sub 1-Torr energy plasma treatment does not damage silicon, the treatment time is not so critical and a timed treatment plan is acceptable. At the beginning of the hydrogenation process the monatomic hydrogen passivates the outer interstitial-rich parts of the disordered regions. This hydrogen does not accumulate to transform into the platelets. Hydrogen attached to the silicon broken bonds in the interstitial-rich part has a low binding energy. Under the subsequent platelet nucleating anneal step this hydrogen effuses away before the platelets are nucleated. However, this step highly increases the permeability to hydrogen of the interstitial-rich sublayer, and the next portion of hydrogen diffuses easily through the interstitial-rich sublayer which is now passivated to the deeper vacancy-rich sublayer. The diffusing hydrogen is now strongly trapped onto the vacancy-rich sublayer.

Different hydrogen plasma chamber designs are also effective. A radio frequency parallel plate plasma chamber, an electron cyclotron resonance microwave system, and other designs using state of the art that is described in for example, "Handbook of Plasma Processing Technology: Fundamentals, Etching, Deposition, and Surface Interactions" by Stephen M. Rossnagel, Jerome J. Cuomo, William D. Westwood, Noyes Publications, 1990.

This preferred embodiment may be compared to separation using direct plasma immersion ion implantation [5]. The comparison is given to show an advantage of the inventive process over the process due to [5]. The process [5] requires an implant dose of $10^{18}$ cm$^{-2}$ or larger. The process due to present invention delivers hydrogen predominantly into thin, buried trap layer. Therefore, lower (~$10^{17}$ cm$^{-2}$) amount of hydrogen is needed for the separation. In the present invention, low energy plasma can be used, because the hydrogen is delivered to a predetermined depth by a diffusion process, and not by implantation action of plasma alone. Accordingly, the top silicon layer is not deeply damaged allowing fabricating high quality SOI wafers.

It should be understood that the foregoing description is only illustrative of the invention. Various alternatives and modification can be devised by those skilled in the art without departing from the invention. Accordingly, the present invention is intended to embrace all such alternatives, modifications and variances which fall within the scope of the appended claims.

What is claimed is:

1. A process comprising:
   disordering a first region of a first substrate;
   diffusing hydrogen into said first region of said first substrate by an electrolytic process;
   adding a first amount of energy to said first region of said first substrate; and
   separating at least a part of said first region from said first substrate.

2. The process of claim 1 wherein said first substrate is a crystalline semiconductor.

3. The process of claim 2 wherein said element is the same as said semiconductor.

4. The process of claim 1 wherein diffusing hydrogen further comprises diffusing hydrogen into said first region of said first substrate by electrically connecting said substrate to an electrolytic cell and by exposing said first substrate to an electrolyte contained in said electrolytic cell.

5. The process of claim 4 wherein:
   said electrolyte dissociates to release monatomic hydrogen; and
   said electrolyte does not substantially damage said first substrate.

6. The process of claim 1 wherein disordering comprises implanting a hydrogen trap-inducing element in a first region of a first substrate.

7. The process of claim 1 wherein said first amount of energy is sufficient to form a plurality of hydrogen-filled platelets in said first region of said first substrate.

8. The process of claim 1 wherein adding said first amount of energy to said first region comprises heating said region to a temperature of at least about 200° C.

9. The process of claim 7 wherein separating said part of said first region comprises adding a second amount of energy to said hydrogen-containing platelets.

10. The process of claim 1 wherein separating said part of said first region comprises heating said first region to a temperature of at least about 300° C.

11. The process of claim 1 further comprises attaching a second substrate to said first region of said first substrate, wherein the attachment occurs before said part of said first region is separated from said first substrate.

12. A method comprising:
    forming an amorphous layer in a first crystalline substrate by displacing atoms from regular lattice positions in said first crystalline substrate;
    diffusing hydrogen into said amorphous layer of said first crystalline substrate by an electrolytic process; and
    adding energy to said first crystalline substrate in an amount sufficient to physically separate a thin layer from said first crystalline substrate.

13. The method of claim 12 wherein said atoms are displaced by implanting an element in said first crystalline substrate.

14. The method of claim 13 wherein said first crystalline substrate is silicon and said element is silicon.

15. The method of claim 12 wherein an oxide layer is disposed on a first surface of said first crystalline substrate, the method further comprising attaching a second substrate to said oxide layer.

16. The method of claim 15 wherein said oxide layer and said second substrate are attached to said thin layer.

17. The method of claim 16 wherein a thickness of said thin layer is in a range of about 0.1 to 0.8 microns.

18. A method for making a silicon-on-insulator wafer, comprising:
    forming a gettering layer in a first silicon substrate;
    diffusing hydrogen into said gettering layer substrate by an electrolytic process;
    attaching a second silicon substrate to an oxide layer that is disposed on a first surface of said first silicon substrate, wherein said first substrate, said oxide layer and said second substrate define an assemblage; and
    separating said assemblage into a first portion and a second portion at said gettering layer, wherein said first portion comprises said second substrate, said oxide layer, and a part of said first substrate.

* * * * *